United States Patent [19]

Skutta

[11] 4,013,964
[45] Mar. 22, 1977

[54] AUTOMATIC GAIN CONTROL MEANS FOR A SINGLE SIDEBAND RADIO RECEIVER

[75] Inventor: Frank Robert Skutta, Arlington Heights, Ill.

[73] Assignee: Motorola, Inc., Schaumburg, Ill.

[22] Filed: Oct. 22, 1975

[21] Appl. No.: 624,615

[52] U.S. Cl. .............................. 325/319; 325/404; 325/405; 325/409; 325/410

[51] Int. Cl.² .......................................... H04B 1/16

[58] Field of Search .......... 325/400, 404, 405, 408, 325/410, 411, 319, 329, 409; 178/7, 3 R, 3 D, 3 C

[56] References Cited

UNITED STATES PATENTS

| | | | |
|---|---|---|---|
| 2,245,353 | 6/1941 | Morlock | 325/404 |
| 2,472,301 | 6/1949 | Koch | 325/404 |
| 2,556,070 | 6/1951 | De Groot et al. | 325/410 |
| 2,957,074 | 10/1960 | Trevor | 325/329 |
| 3,116,453 | 12/1963 | Lennon et al. | 325/319 |
| 3,154,740 | 10/1964 | Eness | 325/329 |
| 3,199,044 | 8/1965 | Morris | 325/410 |
| 3,450,834 | 6/1969 | De Marinis et al. | 325/410 |

*Primary Examiner*—Robert L. Griffin
*Assistant Examiner*—Marc E. Bookbinder
*Attorney, Agent, or Firm*—James W. Gilman; Victor Myer

[57] ABSTRACT

An audio derived AGC signal for controlling RF and/or IF amplifiers in the radio receiver wherein a first control signal is developed by a circuit having a relatively slow response time when the audio output signal is below a predetermined value and a second control signal is developed by a circuit having a relatively fast response time when the audio output signal is at or above the predetermined value. The control signals are developed across a storage capacitor and a circuit is connected thereto for quickly discharging the capacitor when no signal is being supplied from the audio circuit.

7 Claims, 2 Drawing Figures

4,013,964

AUTOMATIC GAIN CONTROL MEANS FOR A SINGLE SIDEBAND RADIO RECEIVER

BACKGROUND OF THE INVENTION

The present apparatus pertains to an automatic gain control circuit for a single sideband receiver. A single sideband signal contains the information from one of the sidebands of an amplitude modulated signal without the carrier and other sideband information. Since the single sideband receiver does not have a carrier reference level to set its AGC, information contained in the sideband must be used to keep a constant audio output level. In conversation, voice levels constantly change in amplitude and it is difficult to control a 100 db range in carrier level and also have natural voice quality without harshness due to the AGC attacking and decaying with every syllable.

In many prior art receivers RF or IF derived AGC signals are utilized to control the gain of the RF and/or IF amplifiers. However, these circuits can be extremely unstable because of the high frequencies utilized and a great amount of care must be utilized in the design and placement of the circuits. In many instances shielding is required to prevent oscillations and unwanted interference.

SUMMARY OF THE INVENTION

The present invention pertains to a single sideband radio receiver with signal amplifying means adapted to receive a signal for controlling the gain thereof and audio amplifying means providing an audio output signal and further having automatic gain control means including capacitive storage means coupled to the signal amplifying means for supplying a signal to control the gain thereof, first coupling circuitry connecting the audio output signal to the capacitive storage means in a first charging path for charging the capacitive storage means at a first predetermined rate and second coupling circuitry, including switching means only operative when the audio output signal exceeds a predetermined value, connecting the audio output signal to the capacitive storage means in a second charging path, when said switching means is operative, for charging said capacitive storage means at a second predetermined rate faster than the first predetermined rate.

It is an object of the present invention to provide a new and improved automatic gain control means for a single sideband radio receiver.

It is a further object of the present invention to provide a new and improved automatic gain control means for a single sideband receiver utilizing an audio derived AGC with fast and slow rates of response so that voice quality is maintained without degrading the attack and decay times of the AGC.

These and other objects of the present invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
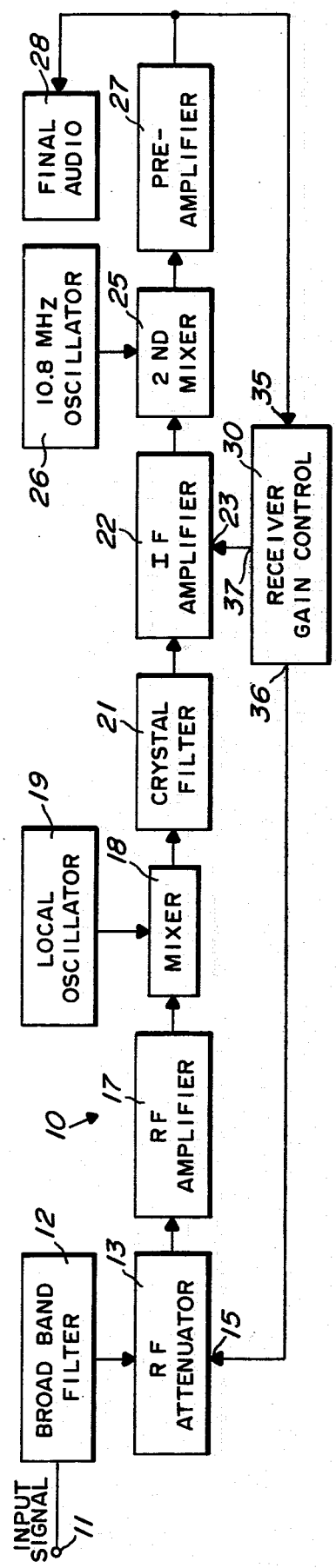
FIG. 1 is a block diagram of a single sideband receiver including an embodiment of the present invention.

Referring specifically to FIG. 1, a single sideband receiver, generally designated 10, is illustrated with an embodiment of a receiver gain control circuit constructed in accordance with the present invention attached thereto. The receiver includes a terminal 11 adapted to receive an input signal from an antenna, preamplifier, or the like. The signal from the terminal 11 is supplied through a broadband filter 12 to an RF field effect transistor attenuator 13. The attenuator 13 has a control input 15 and controls the attenuation of the signal passing therethrough in accordance with the amplitude of a DC signal applied to the input 15. Attenuators of this type are well known in the art and, since it does not form a portion of this invention, will not be described in detail. The output of the attenuator 13 is supplied through an RF amplifier 17 to a mixer 18, which also receives a signal from a local oscillator 19. The mixer 18 mixes the RF signal with the local oscillator signal to produce an intermediate frequency signal which is filtered by a crystal filter 21 and applied to IF amplifier circuitry 22. The IF amplifiers 22 also include circuitry for attenuating the signal passing therethrough in accordance with a DC signal applied to a control input 23. Again, attenuating circuits of this type are well known in the art and, since this circuit does not form a portion of the invention, will not be described in detail. The output of the IF amplifier 22 is supplied to a second mixer 25, which also receives a signal from an oscillator 26. The mixer 25 combines the intermediate frequency signals from the amplifiers 22 and the signal from the oscillator 26 to provide detected audio at the output thereof, which audio is applied through a preamplifier 27 to final audio amplifiers 28.

In the embodiment of the present invention, audio signals are supplied from the audio circuitry, including the preamp and/or the final amplifiers, to the receiver gain control circuit 30 and DC signals are supplied to control terminals 15 and 23 of the RF and IF attenuators 13 and 22, respectively, under specific conditions to be set forth presently. The input terminal of the gain control circuit 30 is designated 35 and the output terminals connected to the RF attenuator 13 and IF amplifiers 22 are designated 36 and 37, respectively. An embodiment of the receiver gain control circuit 30, constructed in accordance with the present invention, is illustrated schematically in FIG. 2.

Figure 2:
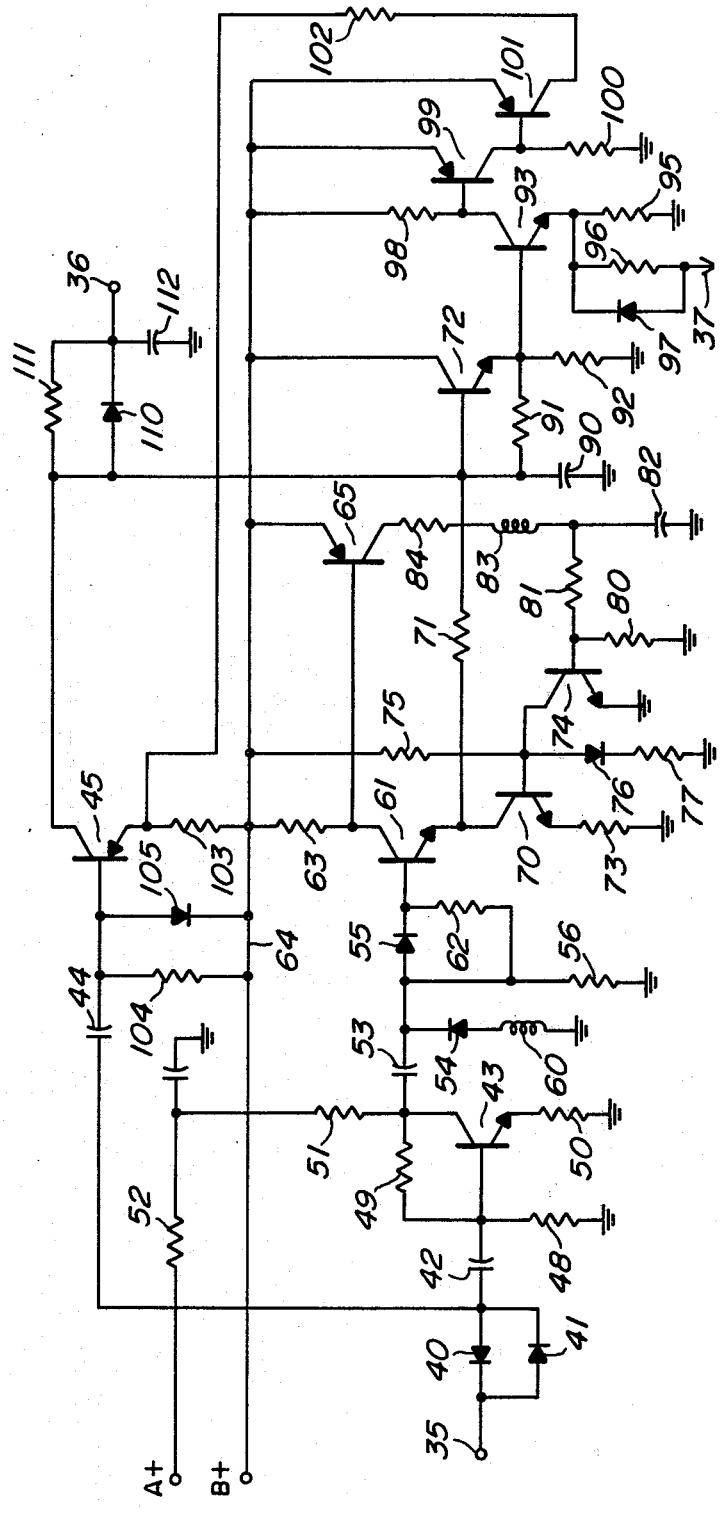
FIG. 2 is a schematic diagram of the receiver gain control circuit illustrated in block form in FIG. 1.

Referring specifically to FIG. 2, the input terminal 35 of the gain control circuit 30 is connected to one terminal of a pair of diodes 40 and 41 connected in parallel opposition. The other terminal of the diodes 40 and 41 is connected through a coupling capacitor 42 to the base of an NPN type transistor 43 and through a second coupling capacitor 44 to the base of a PNP type transistor 45. The base of the transistor 43 is also connected through a resistor 48 to ground and through a resistor 49 to the collector thereof. The emitter of the transistor 43 is connected to ground through a resistor 50. The collector of the transistor 43 is connected through a pair of series connected resistors 51 and 52 to a terminal designated A+, adapted to be connected to a source of positive voltage (not shown). The collector of the transistor 43 is also connected through a coupling capacitor 53 to the cathode of a diode 54, to the anode of a diode 55 and through a resistor 56 to ground. The anode of the diode 54 is connected through an inductance 60 to ground. The cathode of the diode 55 is connected to the base of an NPN type transistor 61 and a resistor 62 is connected in parallel therewith. The collector of the transistor 61 is connected through a resistor 63 to a positive bus 64 connected to a terminal designated B+, which is adapted to be connected to a positive source of voltage (not shown) somewhat lower than the voltage at the A+ terminal. The collector of the transistor 61 is also connected to the base of a PNP type transistor 65. The emitter of the transistor 61 is connected to the collector of an NPN type transistor 70 and through a resistor 71 to the base of an NPN type transistor 72. The emitter of the transistor 70 is connected to ground through a resistor 73 and the base is connected directly to the collector of an NPN type transistor 74. The collector of the transistor 74 is also connected to the B+ bus 64 through a resistor 75 and through a diode 76 and resistor 77 to ground. The emitter of the transistor 74 is connected directly to ground. The base of the transistor 74 is connected to ground through a resistor 80 and through a series connected resistor 81 and capacitor 82 to ground. The junction of the resistor 81 and capacitor 82 is connected through a series connected inductance 83 and resistor 84 to the collector of the transistor 65. The emitter of the transistor 65 is connected directly to the B+ bus 64. A storage capacitor 90 is connected from the base of the transistor 72 to ground. A resistor 91 is connected from the base of the transistor 72 to the emitter thereof. The collector of the transistor 72 is connected directly to the B+ bus 64 and the emitter is connected through a resistor 92 to ground and directly to the base of an NPN type transistor 93. The emitter of the transistor 93 is connected through a resistor 95 to ground and through a resistor 96 to the output terminal 37. The resistor 96 has a germanium diode 97 connected in parallel therewith. The collector of the transistor 93 is connected through a resistor 98 to the B+ bus 64 and directly to the base of a PNP type transistor 99. The emitter of the transistor 99 is connected directly to the B+ bus 64 and the collector is connected through a resistor 100 to ground and directly to the base of a PNP type transistor 101. The emitter of the transistor 101 is connected directly to the B+ bus 64 and the collector is connected through a resistor 102 to the emitter of the transistor 45. The emitter of the transistor 45 is also connected through a resistor 103 to the B+ bus 64. The base of the transistor 45 has a resistor 104 and diode 105 connected in parallel thereto and to the B+ bus 64. The collector of the transistor 45 is connected directly to the base of the transistor 72 (and one side of the storage capacitor 90) and through a parallel connected germanium diode 110 and resistor 111 to the output terminal 36. The output terminal 36 is also connected to ground through a bypass capacitor 112.

In the operation of the present circuit, audio is applied to the parallel diodes 40 and 41 and only the peaks in excess of the amount required to bias the diodes 40 and 41 into conduction are conducted to the capacitors 42 and 44. The diodes 40 and 41 are utilized to limit the rise of the audio signal so that excessive signals can be more easily controlled. The audio peaks from the diodes 40 and 41 are amplified by the transistor 43 and the negative peaks at the collector of transistor 43 are conducted to ground by the diode 54 while the positive peaks are applied to the base of the transistor 61 by the diode 55. When the peaks are sufficient to cause conduction of the transistor 61, a path is completed from the B+ bus 64 through the resistor 63, transistor 61 and resistor 71 to the storage capacitor 90. As the storage capacitor 90 charges to the peak value of the audio signal applied thereto, this DC potential is applied through the diode 110 and resistor 111 to the output terminal 36, which is connected to the RF attenuator 13. Thus, the DC voltage applied to the RF attenuator 13 tends to maintain the audio signal applied to the input terminal 35 of the gain control circuit at a constant level.

If the peak voltage of the input audio signal is reduced, the capacitor 90 discharges slowly through the resistors 91 and 92. Because the base to emitter junction of the transistor 72 is in parallel with the resistor 91, the voltage across the resistor 91 remains constant and, thereby, gives the capacitor 90 a constant discharge rate.

With the initial turn on of the transistor 61, the transistor 65 also turns on supplying a charging current to the capacitor 82. The capacitor 82 charges rapidly to approximately the potential of the B+ bus 64 and remains charged as long as audio signals are applied to the transistor 61. Once the audio signals cease and the transistors 61 and 65 cease conduction, the capacitor 82 begins to discharge through the resistors 80 and 81. This discharge turns on transistor 74 after a predetermined delay (in the embodiment 0.8 sec.), which in turn turns on transistor 70. With transistor 70 conducting the capacitor 90 has a low resistance discharge path to ground and, consequently, quickly discharges. This quick discharge path is provided so that, once an audio signal is terminated, the gain control circuit will be quickly prepared for additional signals that may follow. If, for example, the capacitor 90 remain charged to a high level any weak signals which followed would not be received by the receiver 10 because of the attenuation in the RF attenuator 13.

In the present embodiment, the transistor 45 is biased to conduct when an audio signal with negative peaks in excess of approximately 0.7 volts is applied to the base thereof. Thus, when an audio signal with a peak to peak voltage in excess of approximately 2.4 volts is applied to the terminal 35 a peak to peak voltage of approximately 1.2 volts appears at the base of the transistor 45 causing conduction thereof. It should be noted that the diodes 40 and 41 reduce the signal by one diode drop in both the positive and negative directions. With the transistor 45 conducting current is free to flow from the B+ bus through the parallel connected resistor 103 and transistor 101, which is normally conducting, and resistor 102 and transistor 45 to the storage capacitor 90. Thus, a relatively low resistance charging path is opened for the capacitor 90 whenever the input signal exceeds approximately 2.2 volts and the capacitor 90 is quickly charged to the peak voltage of the input audio signal so that sufficient DC control voltage appears at the output terminal 36 to quickly increase the attenuation in the RF amplifiers. Once the signal has been reduced to something below 2.2 volts the charge on the capacitor 90 is again controlled only by conduction of the transistor 61. Thus, a first charging path for the capacitor 90 is provided through the transistor 61 with a response time which is sufficiently fast to control normal voice variations. However, the charging rate of the first charging path is long relative to the time required to set the receiver gain control level, initially or after large variations of input level. When the input signal increases substantially and remains at a high level, a second charging path through the transistor 45 is added to the first charging path to greatly decrease the attack time of the circuit. It should, of course, be understood that 2.2 volts is used as the threshold in this explanation but anyone skilled in the art could construct the circuit to provide any desired threshold.

In actual practice the RF attenuator 13 has a dynamic range of approximately 40 db before the DC potential supplied by the AGC circuit is sufficient to approach the maximum attenuating capabilities. Therefore, in the present embodiment some additional attenuation is supplied by the IF amplifier. At a predetermined level near the maximum of the RF attenuator, in this embodiment approximately 4.5 volts, the gain control circuit begins to apply attenuation control signals to the IF amplifier. This provides a total in excess of 100 db of attenuation.

When the audio signal at the terminal 35 reaches a peak value such that the charge on the capacitor 90 becomes sufficient to cause conduction of the transistor 93, transistor 93 turns on driving transistor 99 into saturation, which turns off transistor 101 and removes the resistor 102 from the fast charge path. Terminal 37 has DC current flowing into it and through resistors 96 and 95 to ground. This sets a DC reference potential at the emitter of transistor 93. The potential at the base of transistor 93 must exceed this DC potential for transistor 93 to turn on. The charge rate for the capacitor 90 is reduced to prevent the system from overshooting on excessively high input signals and blanking out portions of the signals. Also, once the transistor 93 begins to conduct an output signal is supplied to the output terminal 37. As previously explained, this output signal is used to control the IF amplifier to further reduce the gain of the receiver so that the audio output is within the desired level. The slower charge rate is used in connection with the IF automatic gain control because the IF amplifier is more sensitive to a given change in the automatic gain control DC level than the RF attenuator.

Thus, an automatic gain control circuit for receiver gain control is illustrated and described, which circuit includes a first charging path to provide the circuit with a first response time which, in this embodiment, is approximately 15 milliseconds attack time. If the audio signal peaks exceed a predetermined value the attack time is increased and if the charge stored in the storage capacitor exceeds a predetermined value (i.e. approaches the upper limit of the RF attenuator) the fast charge rate of the circuit is reduced slightly to prevent overshoot and the IF attenuation is applied. As long as audio signals are present the circuit has a slow rate of decay (in this embodiment approximately 0.8 sec. after any decrease in amplitude of the input signal) and when audio is removed from the input for approximately 0.8 sec. the decay rate of the circuit increases substantially. It should be understood from the foregoing disclosure that the various attack times and charge paths cooperate to maintain the signal at the output of the receiver 10 approximately constant. Further, the first charging path, which provides the slower attack time, operates chiefly to filter the signal fed back to the RF attenuation circuit 13 when it is operating alone, i.e. the audio input signal at the terminal 35 remains substantially constant. To accomplish these functions, the values of the various components in the present embodiment of the gain control circuit are set forth below.

| Resistors | Value | |
|---|---|---|
| 48 | 10 K ohms | |
| 49 | 39 K | |
| 50 | 180 | |
| 51 | 2.2 K | |
| 52 | 220 | |
| 56 | 82 K | |
| 62 | 15 K | |
| 63 | 39 K | |
| 71 | 1.5 K | |
| 73 | 3.9 K | |
| 75 | 47 K | |
| 77 | 3.9 K | |
| 80 | 150 K | |
| 81 | 150 K | |
| 84 | 220 | |
| 91 | 47 K | |
| 92 | 47 K | |
| 95 | 15 K | |
| 96 | 4.7 K | |
| 98 | 8.2 K | |
| 100 | 3.9 K | |
| 102 | 33 | |
| 103 | 100 | |
| 104 | 2.2 K | |
| 111 | 39 K | |
| Capacitors | | |
| 42 | .1 Mfd | |
| 44 | .1 | |
| 53 | .1 | |
| 82 | 2.2 | |
| 90 | 22 | |
| Inductances | | |
| 60 | 100 mh | |
| 83 | 100 | |
| Transistors | | |
| 43 | 48R869642 | (Motorola Part No.) |
| 61 | " | |
| 70 | " | |
| 72 | " | |
| 74 | " | |
| 93 | " | |
| 45 | 48R869643 | (Motorola Part No.) |
| 65 | " | |
| 99 | " | |
| 101 | " | |
| Diodes | | |
| 40 | 48D83654-H01 | silicon (Motorola Part No.) |
| 41 | " | |
| 54 | " | |
| 55 | " | |
| 76 | " | |
| 105 | " | |
| 97 | 48C82139-G01 | germanium (Motorola Part No.) |
| 110 | " | |
| A+ | | 13 volts |
| B+ | | 9 volts |

Thus, an improved automatic gain control circuit is disclosed which includes several attack and decay times to provide good distortion and voice quality while maintaining good stability in the circuit. While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. Automatic gain control means for a single sideband radio receiver comprising:
    a. signal amplifying means forming a portion of the radio receiver and including an input adapted to receive a signal for controlling the gain of said signal amplifying means;

b. audio amplifying means forming a portion of the radio receiver and providing an audio output signal;

c. capacitive storage means having an output coupled to the input of said signal amplifying means for supplying a signal to control the gain thereof;

d. first coupling circuitry connecting the audio output signal of said audio amplifier means to said capacitive storage means in a first charging path for charging said capacitive storage means at a first predetermined rate; and e. second coupling circuitry, including switching means only operative when the audio output signal exceeds a predetermined value, connecting the audio output signal of said amplifier means to said capacitive storage means in a second charging path, when said switching means is operative, for charging said capacitive storage means at a second predetermined rate faster than the first predetermined rate.

2. Automatic gain control means for a single sideband radio receiver as claimed in claim 1 comprising in addition switch means coupled to the capacitive storage means and to receive the audio output signal and operative to provide a fast discharge path for the capacitive storage means upon the termination of the audio output signal.

3. Automatic gain control means for a single sideband radio receiver as claimed in claim 1 comprising in addition constant rate discharge means connected to the capacitive storage means and including a resistor having one diode drop of a semiconductor connected in parallel therewith for maintaining the voltage thereacross constant.

4. Automatic gain control means for a single sideband radio receiver as claimed in claim 1 comprising in addition second switching means, only operative when the capacitive storage means has a charge therein above a predetermined value, connected to the second coupling circuitry and the capacitive storage means for reducing the second predetermined charging rate upon operation of said second switching means.

5. Automatic gain control means for a single sideband radio receiver as claimed in claim 4 wherein the signal amplifying means includes RF stages and the radio receiver further includes IF stages having an input adapted to receive a signal for controlling the gain of said IF stages and the input of said IF stages is connected to the second switching means for coupling the output of the capacitive storage means to the input of said IF stage and supplying a signal to control the gain thereof upon operation of said second switching means.

6. Automatic gain control means for a single sideband radio receiver as claimed in claim 1 including in addition a pair of diodes connected in parallel opposition and further connected between the audio amplifying means and the first and second coupling circuitry.

7. Automatic gain control means for a single sideband radio receiver as claimed in claim 1 wherein the first coupling circuit is constructed so that the first predetermined rate of charge is long relative to the time required to set the initial receiver gain control level.

* * * * *

UNITED STATES PATENT AND TRADEMARK OFFICE
CERTIFICATE OF CORRECTION

PATENT NO. : 4,013,964
DATED : March 22, 1977
INVENTOR(S) : FRANK ROBERT SKUTTA

It is certified that error appears in the above-identified patent and that said Letters Patent are hereby corrected as shown below:

In Column 5, line 49, change "increased" to -- decreased --.

Signed and Sealed this

Eleventh Day of September 1979

[SEAL]

Attest:

LUTRELLE F. PARKER

*Attesting Officer*   *Acting Commissioner of Patents and Trademarks*